(12) United States Patent
Strachan et al.

(10) Patent No.: US 9,013,177 B2
(45) Date of Patent: Apr. 21, 2015

(54) PROGRAMMABLE ANALOG FILTER

(75) Inventors: John Paul Strachan, Millbrae, CA (US); Philip J. Kuekes, Menlo Park, CA (US); Gilberto Medeiros Ribeiro, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1212 days.

(21) Appl. No.: 12/913,657

(22) Filed: Oct. 27, 2010

(65) Prior Publication Data

US 2012/0105143 A1    May 3, 2012

(51) Int. Cl.
| G01B 7/14 | (2006.01) |
| H03K 19/173 | (2006.01) |
| G06F 13/00 | (2006.01) |
| G06K 7/00 | (2006.01) |
| G06K 19/067 | (2006.01) |
| H03H 1/02 | (2006.01) |
| H03H 7/06 | (2006.01) |
| H03H 1/00 | (2006.01) |

(52) U.S. Cl.
CPC ............ *G06K 7/0008* (2013.01); *G06K 19/067* (2013.01); *H03H 1/02* (2013.01); *H03H 7/06* (2013.01); *H03H 2001/0064* (2013.01)

(58) Field of Classification Search
None
See application file for complete search history.

(56) References Cited

U.S. PATENT DOCUMENTS

| 7,302,513 B2 * | 11/2007 | Mouttet .................. 710/317 |
| 7,447,828 B2 | 11/2008 | Mouttet |
| 7,609,086 B2 | 10/2009 | Mouttet |
| 7,985,962 B2 * | 7/2011 | Bratkovski et al. ............ 257/4 |
| 2008/0172385 A1 | 7/2008 | Mouttet |
| 2008/0307151 A1 | 12/2008 | Mouttet |
| 2011/0076810 A1 * | 3/2011 | Xia et al. .................. 438/129 |
| 2011/0199814 A1 * | 8/2011 | Meade .................... 365/149 |
| 2011/0266515 A1 * | 11/2011 | Pickett et al. ................ 257/5 |

OTHER PUBLICATIONS

T. Driscoll, et al.; "Memristive Adaptive Filters"; Appl. Phys. Lett.; http://apl.aip.org/resource/1/applab/v97/i9/p093502_s1?isAuthorized=no, (2010).
Massimiliano Di Ventra, et al.; "Circuit Elements With Memory: Memristors, Memcapacitors, and Meminductors"; Proceedings of the IEEE; vol. 97; No. 10; Oct. 2009; pp. 1717-1724.
Farnood Merrikh-Bayat, et al.; "Mixed Analog-Digital Crossbar-Based Hardware Implementation of Sign-Sign LMS Adaptive Filter"; Analog Integr Circ Sig Process; Aug. 19, 2010; Springer Science+Business Media, LLC.; http://www.springerlink.com/content/5878u33522636810/.
U.S. Appl. No. 12/548,124, filed Aug. 26, 2009 entitled "Memcapacitive Devices".

* cited by examiner

*Primary Examiner* — Minh N Tang
(74) *Attorney, Agent, or Firm* — Van Cott, Bagley, Cornwall & McCarthy

(57) ABSTRACT

A programmable analog filter includes a crossbar array with a number of junction elements and a filter circuit being implemented within the crossbar array. At least a portion of the junction elements form reprogrammable components within the filter circuit. A method for using a programmable analog filter is also provided.

20 Claims, 11 Drawing Sheets

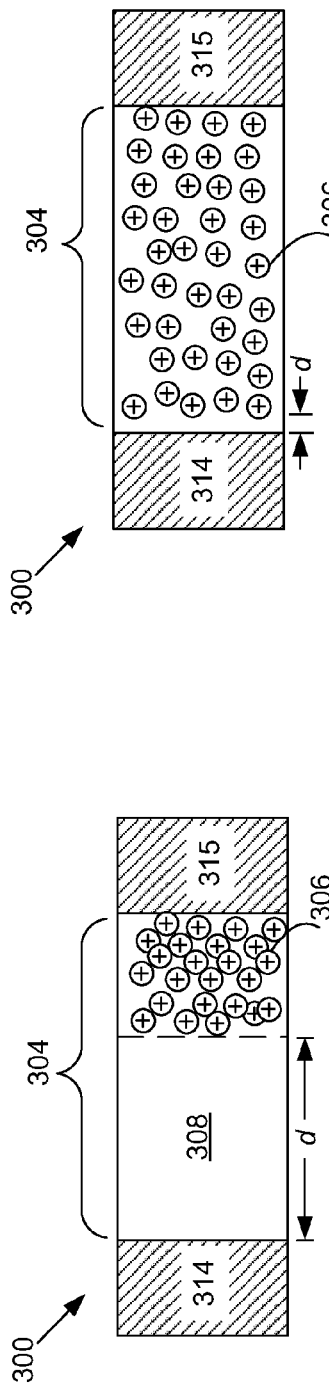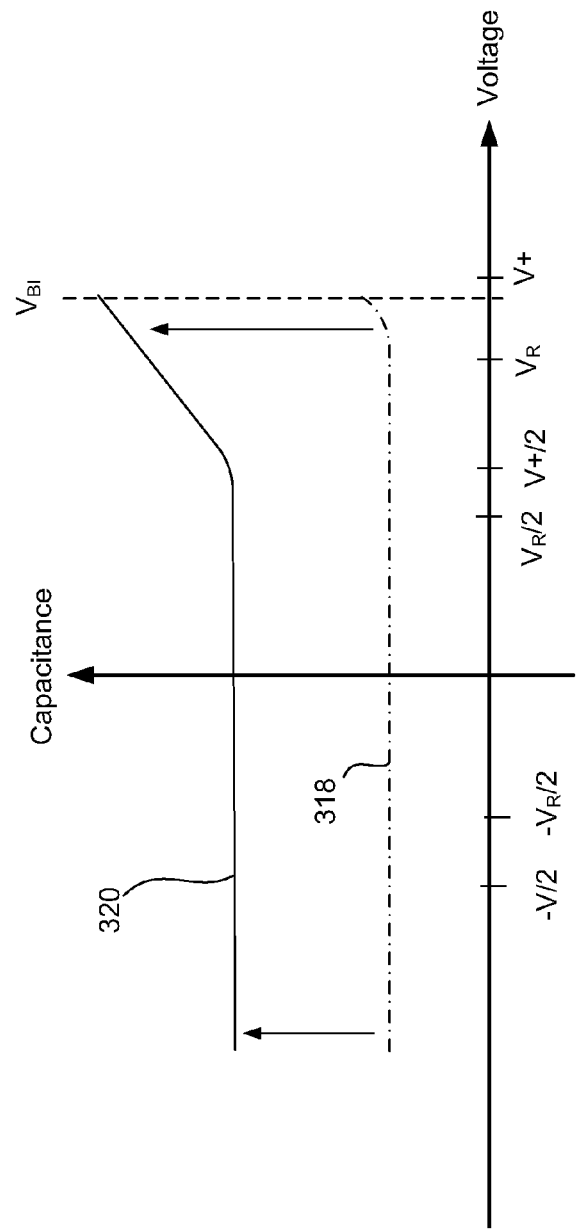

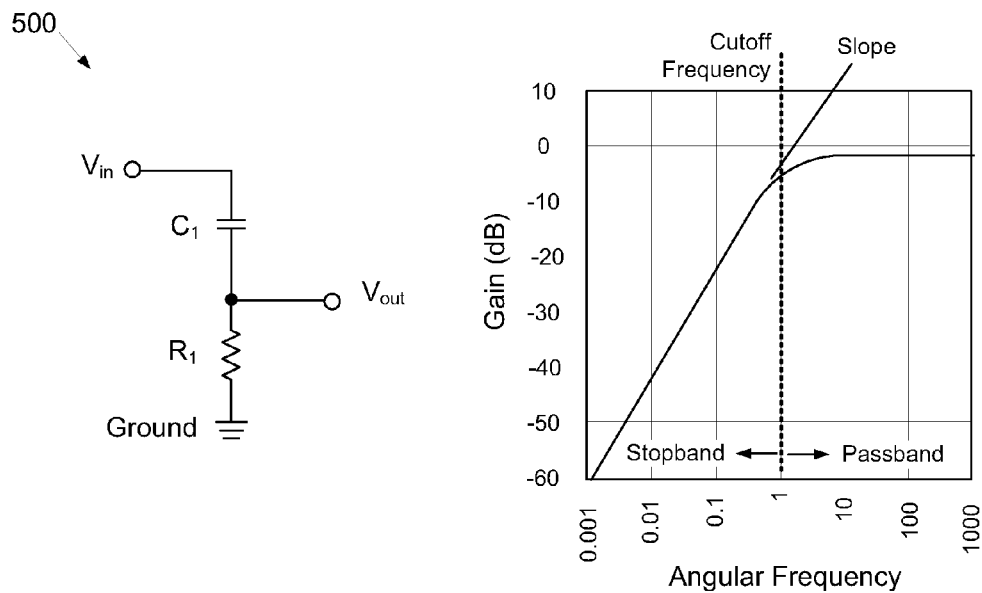
Fig. 5A    Fig. 5B
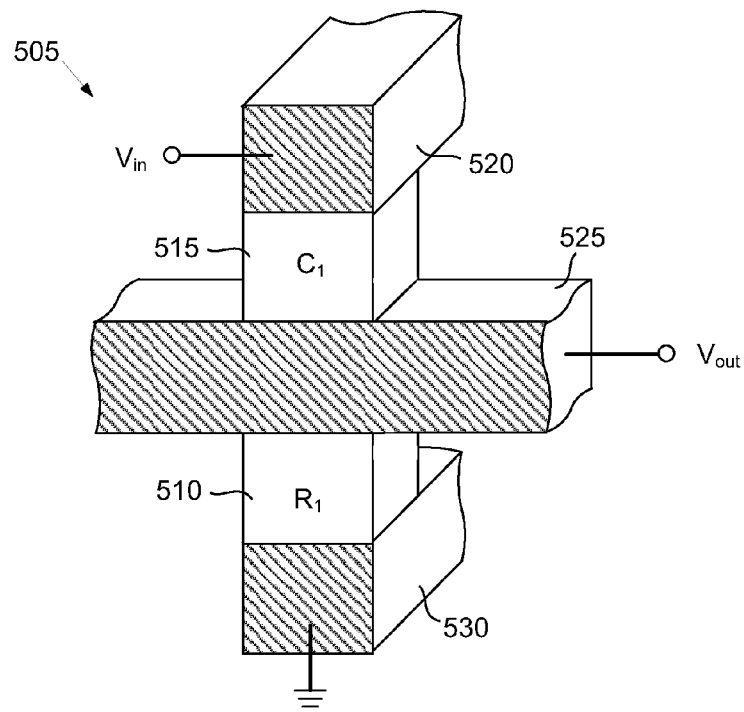
Fig. 5C

PROGRAMMABLE ANALOG FILTER

BACKGROUND

In many communications and signal routing applications, it is desirable to have an analog filter which only operates on specific waveforms or frequencies. This may allow for identification, analysis, and manipulation of the waveforms. Ideally, this analog filter should be more than a single bandpass filter which would only pass a certain frequency range. For broader application, an analog filter which is configured to analyze a wider range of frequencies is desirable. Further, the analog filter should have a small geometric size, dissipate a low amount of power, and be easily reconfigurable to exhibit a variety of different filtering profiles across the spectrum.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIGS. 3A-3C are diagrams which show operating principles of a memcapacitive device, according to one example of principles described herein.

FIGS. 5A-5C are diagrams which describe an illustrative high pass filter and its implementation within a nanowire crossbar architecture, according to one example of principles described herein.

Throughout the drawings, identical reference numbers designate similar, but not necessarily identical, elements.

DETAILED DESCRIPTION

Figure 1:
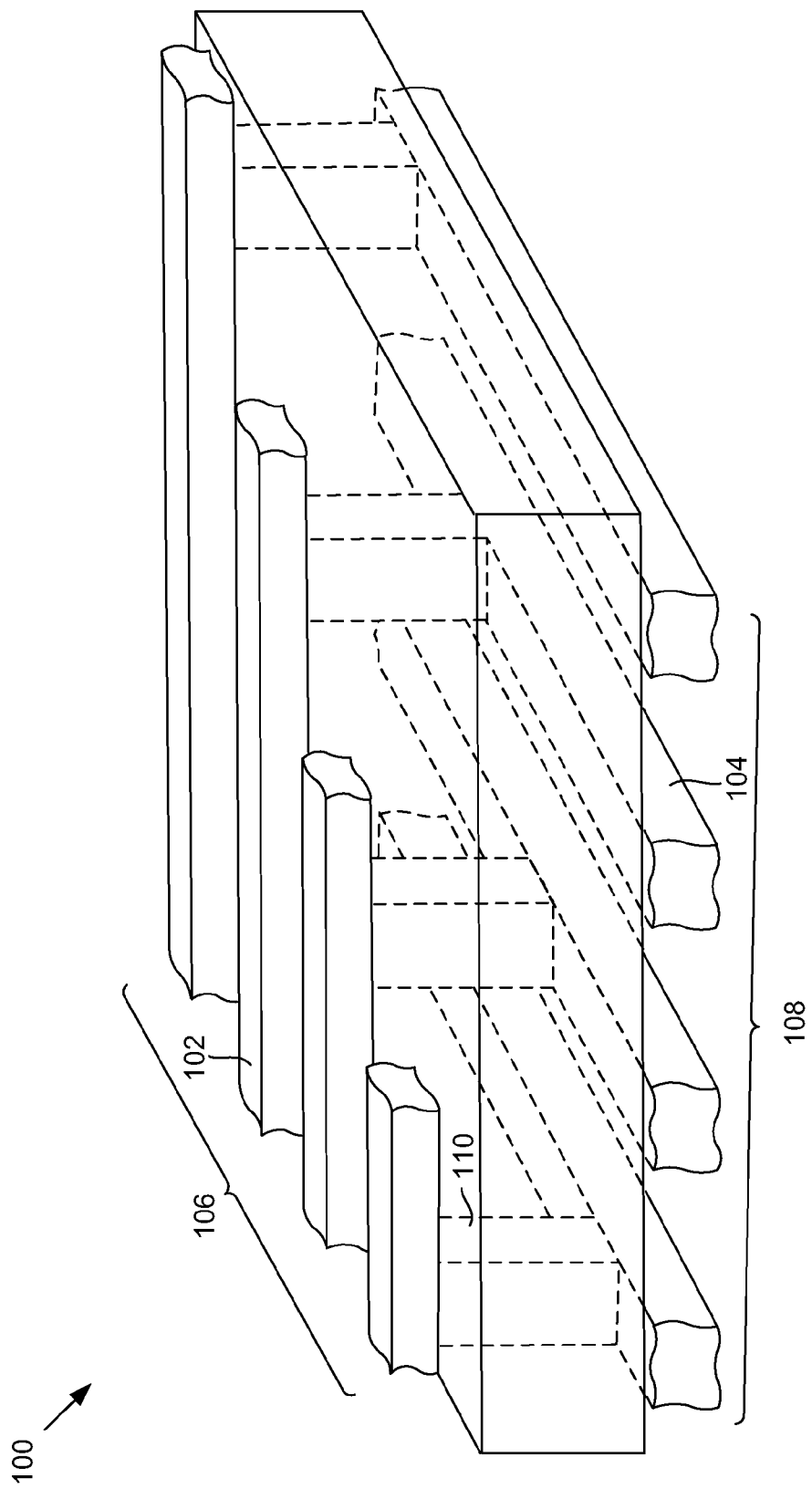
FIG. 1 is an isometric view of an illustrative nanowire crossbar architecture, according to one example of principles described herein.

In many communications and signal routing applications, it is desirable to have an analog filter which only operates on specific waveforms or frequencies. This may allow for identification, analysis, and manipulation of the waveforms. Ideally, this analog filter should be more than a single bandpass filter which would only pass a certain frequency range. For broader application, an analog filter which is configured to analyze a wider range of frequencies is desirable. Further, the analog filter should have a small geometric size, dissipate a low amount of power, and be easily reconfigurable to exhibit a variety of different filtering profiles across the spectrum.

The specification below describes a programmable analog filter which is implemented in a nanowire crossbar architecture. The nanowire crossbar architecture may include memristive and/or memcapacitive junction elements which form integral parts of the circuit. These memristive and memcapacitive junction elements can be readily reconfigured to exhibit different resistances or capacitances. Once reconfigured, the memristive and memcapacitive junction elements maintain their properties until they are reprogrammed. By incorporating these junction elements in a nanowire crossbar array, the analog filter is readily reprogrammable and reconfigurable. In some examples, thousands of spectral channels can be separately filtered by a single nanowire crossbar array. Additionally, the analog filter has a small footprint, low power dissipation, and can be implemented at low cost.

One illustrative application for such a filter is in the remote sensing of materials based on the absorption/reflection of incident broadband microwave power. Each material will have a characteristic profile for frequencies which are either absorbed or transmitted. The reprogrammable analog filter could be used to analyze the resulting profiles and measure the degree to which the reflected or transmitted spectral profiles match that of a specific material. The same concept can be applied to Radio Frequency ID (RFID) tags. For example, a programmable analog filter can be used to analyze the signal returned by an RFID tag. Additionally or alternatively, the programmable analog filter could be used within an RFID tag to create an identifying signature when the RFID tag is illuminated with radiowaves.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one example, but not necessarily in other examples. The various instances of the phrase "in one example" or similar phrases in various places in the specification are not necessarily all referring to the same example.

Throughout the specification and appended claims the term "memristor" or "memristive" is used to describe a matrix/dopant combination which exhibits dopant motion in the presence of a programming electrical field and long-term dopant stability within the matrix when the programming field is removed. This memristive effect is most strongly evident in nanometer scale devices and allows the device to "remember" past electrical conditions.

FIG. 1 shows an isometric view of an illustrative nanowire crossbar architecture (100). The crossbar array (100) is composed of a lower layer of approximately parallel nanowires (108) that are overlain by an upper layer of approximately parallel nanowires (106). The nanowires of the upper layer (106) are roughly perpendicular, in orientation, to the nanowires of the lower layer (108), although the orientation angle between the layers may vary. The two layers of nanowires (106, 108) form a lattice, or crossbar, in which each nanowire of the upper layer (106) overlies all of the nanowires of the lower layer (108). A number of junction elements (110) may be formed between the crossing nanowires at these intersections. Consequently, each wire (102) in the upper layer (106)

is connected to every wire (104) in the lower layer (108) through a junction element (110) and vice versa. These junctions (110) may perform a variety of functions including providing programmable switching, capacitance, and/or resistance between the nanowires (102, 104).

Although individual nanowires (102, 104) in FIG. 1 are shown with rectangular cross sections, nanowires can also have square, circular, elliptical, or more complex cross sections. The nanowires (102, 104) may also have many different widths or diameters and aspect ratios or eccentricities. The term "nanowire crossbar" may refer to crossbars having one or more layers of sub-microscale wires, microscale wires, or wires with larger dimensions, in addition to nanowires.

The layers may be fabricated using a variety of techniques including conventional photolithography as well as mechanical nano-imprinting techniques. Alternatively, nanowires can be chemically synthesized and can be deposited as layers of approximately parallel nanowires in one or more processing steps, including Langmuir-Blodgett processes. Other alternative techniques for fabricating nanowires may also be employed, such as interference lithography. Many different types of conductive and semi-conductive nanowires can be chemically synthesized from metallic and semiconductor substances, from combinations of these types of substances, and from other types of substances. A nanowire crossbar may be connected to microscale address-wire leads or other electrical leads, through a variety of different methods in order to incorporate the nanowires into electrical circuits.

The nanowire crossbar architecture (100) may be used in a variety of applications and configurations. For example, crossbars can be used to form nonvolatile memory arrays, routing matrices, and reconfigurable circuits. In some configurations, multiple crossbars can be stacked on top of each other to form a multilayer circuit. In multilayer circuits, junction elements may extend both above and below a given nanowire. Consequently, each nanowire can be interconnected with the nanowires in the underlying or overlying layer.

According to one illustrative example, a nanowire crossbar architecture is integrated with Complimentary Metal-Oxide-Semiconductor (CMOS) or other conventional computer circuitry. This CMOS circuitry can provide additional functionality to the memcapacitor device such as input/output functions, buffering, logic, or other functionality. In other examples, the nanowire crossbar could be independent of CMOS circuitry. For example, a nanowire crossbar could be built on a plastic or other flexible substrates.

FIGS. 2A-2D and FIGS. 3A-3C describe two types of junction elements which can be incorporated into a nanowire crossbar architecture: a memristor and a memcapacitor. These two types of junction elements are only illustrative examples of junction elements which could be used. There are a variety of different configurations and types of junction elements which could be implemented in the crossbar architecture.

The two types of junction elements described below use the presence of mobile dopants within an insulating or semiconducting matrix to dramatically alter the electrical characteristics of the junction element. Dopants can be introduced into a matrix or moved within a matrix to dynamically alter the electrical operation of an electrical device. In some circumstances, the motion of dopants can be induced by the application of a programming electrical field across a suitable matrix. After removal of the electrical field, the location and characteristics of the dopants remain stable until the application of another programming electrical field. Typically the signals processed by the filter will be substantially lower than the programming voltage to prevent unintentional reprogramming of the components. However, in some cases it may be desirable for the state of one or more junction elements within the crossbar array to be influenced by the incoming and/or processed signal. These components can be used to remember and store information about the signal.

Figure 2A:
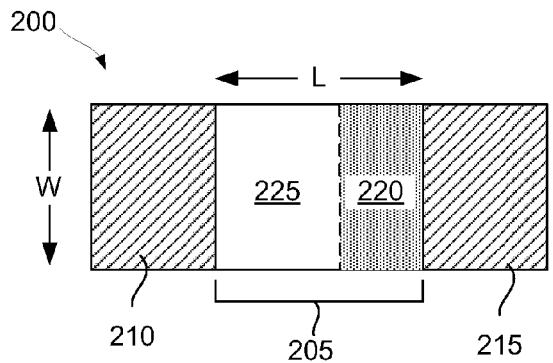
FIGS. 2A-2D are diagrams which show operating principles of a memristive device, according to one example of principles described herein.

FIG. 2A shows an illustrative two-terminal memristive junction (200). The two-terminal memristive switch (200) is comprised of a first electrode (210) and a second electrode (215) which are in electrical and physical contact with the memristive matrix (205). When incorporated into a crossbar array, the upper and lower intersecting crossbars (106, 108; FIG. 1) form the first and second electrodes (210, 215).

Throughout the specification and appended claims, the term "memristive matrix" describes a thin film of a material that is electronically semiconducting or nominally electronically insulating and also a weakly ionic conductor. The memristive matrix is capable of transporting and hosting ions that act as dopants to control the flow of electrons and/or holes through the switch.

The basic mode of operation is to apply an electrical field (the "drift field," which may exceed some threshold for enabling the motion of the ions in the memristive matrix) across the matrix large enough to cause an ionic species to be transported within the memristive matrix via ionic transport. The ionic species are specifically chosen from those that act as electrical dopants for the memristive matrix, and thereby change the electrical conductivity of the matrix from low conductivity (i.e. an undoped semiconductor or insulator—switch-OFF configuration) to high conductivity (doped to provide a higher conductivity—switch-ON configuration) or from high electrical conductivity to low conductivity (switch-ON to switch-OFF). Furthermore, the memristive matrix and the dopant species are chosen such that the drift of the dopants within the memristive matrix is possible but not too facile, to ensure that the memristive junction will remain in whatever state it is set for a reasonably long time, perhaps many years at room temperature and without an electric drift field above the critical field needed for programming. This ensures that the memristive junction is nonvolatile, that is, that it holds its state after the drift field has been removed. There are a number of matrix and dopant combinations which exhibit the characteristics described above.

According to one example, the memristive matrix (205) is initially made up of two portions: an intrinsic (not intentionally doped) portion (225) and a doped portion (220). The intrinsic portion (225) has very few dopants and prevents electrical current from flowing between the two electrodes (210, 215). The second doped portion (220) is conductive and also serves as a source of dopants which can be moved into the intrinsic portion (225) to change the overall electrical conductivity of the memristive matrix (205). Consequently, in the configuration illustrated in FIG. 2A the memristive junction (200) is in a high resistance or non conducting state. Migration of the dopants from the doped portion (220) converts at least a part of the intrinsic portion (225) into an additional part of the doped portion (220) and increases the overall electrical conductivity of the device.

A variety of matrix and dopant combinations can be used to form a memristive junction. According to one illustrative example, the intrinsic portion (225) is comprised of intrinsic titanium dioxide ($TiO_2$). Intrinsic titanium dioxide ($TiO_2$) is an insulator, having a resistivity of approximately $10^{12}$ ohm centimeter at 25° C. The second highly doped layer (220) is comprised of oxygen deficient titanium dioxide ($TiO_{2-x}$), where the subscript "x" indicates that the titanium dioxide has a small deficit of oxygen atoms in the crystal structure. These positively charged oxygen vacancies are the dopants in this example. Even relatively low concentrations of oxygen vacancies (below 2%) result in a large increase of the electrical conductivity within the titanium dioxide. The oxygen vacancies act as electron donors, thus $TiO_{2-x}$ is an n-type semiconductor. Additionally, the oxygen vacancies move within the titanium dioxide under the influence of electrical fields. For example, electrical fields between 10,000 volts per centimeter and 100,000 volts per centimeter may be sufficient to physically relocate the oxygen vacancies.

The memristive matrix (205) has a length of "L" and a width of "W" as shown in FIG. 2A. For purposes of illustration only, assume that the length "L" is 100 nanometers and the width "W" is approximately 50 nanometers. Consequently, to apply an electrical field of 100,000 volts/centimeter across the memristive material (205), a voltage bias of 1 volt would be applied across the electrodes (210, 215).

Figure 2B:
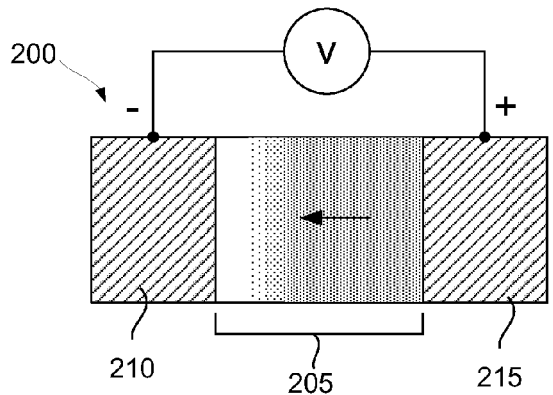

FIG. 2B illustrates the movement of the mobile dopants from the highly doped secondary region (220, FIG. 2A) into the intrinsic primary region (225) as a result of a programming electrical field. The polarity and voltage difference which is applied across the memristive matrix (205) may vary according to a variety of factors including, but not limited to: material properties, geometry of the junction, dopant species, temperature, and other factors. Where titanium dioxide is used as the matrix, the oxygen vacancies have a positive charge, consequently a positive voltage is applied to the right electrode (215) to repulse the oxygen vacancies and drive them toward the left electrode (210).

Figure 2C:
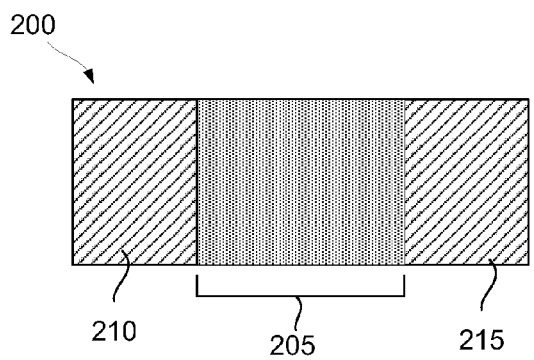

FIG. 2C illustrates the memristive junction in the fully "ON" position, with the dopants fully distributed throughout the memristive matrix (205). The left and right electrodes (210, 215) are electrically connected and can pass lower voltage electrical signals through the memristive matrix (205). As discussed above, the location and distribution of the dopants can remain stable over long periods of time or until another programming voltage is applied.

Figure 2D:
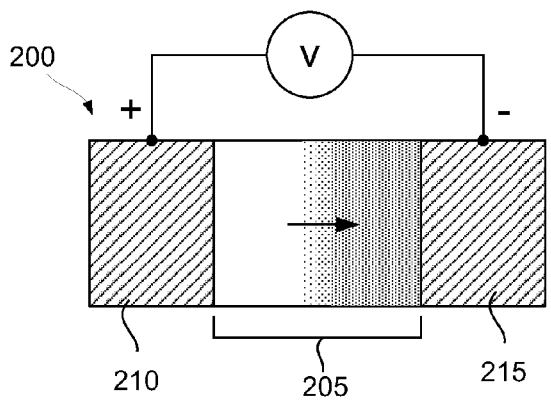

FIG. 2D illustrates the application of another programming voltage to the memristive junction (200). In this case, the purpose of the programming voltage is to return the memristive switch (200) to the fully "OFF" configuration similar to that illustrated in FIG. 2A. Consequently, the applied programming voltage has an opposite polarity from that illustrated in FIG. 2B. A positive voltage is applied to the left electrode (210) and negative voltage is applied to the right electrode (215), thereby driving the dopants to toward the right electrode (215). This returns the left most portion of the memristive matrix (205) to its intrinsic and insulating state. The memristive switch (200) is then in a fully "OFF" configuration.

The transition from the fully "OFF" to fully "ON" configuration or vice versa, is not instantaneous, but can have a number of intermediate states in which the memristive matrix acts as a finite resistance between the two electrodes. These intermediate states may be produced by varying the programming voltage applied across the two electrodes (210, 215) and/or varying the time period during which the programming voltage is applied. Thus, the memristor (200) may act as a switch which electrically connects or disconnects intersecting crossbars, or the memristor may act as a variable resistance between crossbars. In other examples, a memristive device may be used as transistor which is configured to rapidly modulate electrical fields using a control voltage.

FIGS. 3A-3C are diagrams of a memcapacitor which could be used as a junction element in a crossbar array. A memcapacitor is a capacitor which is able to change and hold its state based on experienced electrical conditions. In one illustrative example, the capacitance of the memcapacitors is nonlinear as a function of applied voltage. Although memcapacitors may take any of a number of possible configurations, one illustrative description of basic operational principles of memcapacitors is presented in this specification for purposes of explanation.

A typical capacitor comprises two conducting surfaces with a dielectric material in between. One equation for capacitance is as follows:

$$C = \epsilon_r \epsilon_0 A/d \qquad \text{Eq. 1}$$

where:
  $C$=capacitance measured in farads,
  $\epsilon_r$=relative permittivity,
  $\epsilon_0$=permittivity of free space,
  $A$=area of conducting surfaces measured in square meters, and
  $d$=distance between conducting surfaces measured in meters.

FIG. 3A is an illustrative diagram of a memcapacitor (300) in a low capacitive state. The memcapacitor (300) is made up of a memcapacitive matrix (304) interposed between with two electrodes (314, 315). According to one illustrative example, the left and right electrodes (314, 315) are intersecting wires within a crossbar array. The memcapacitive matrix (300) is a semiconducting material which contains a number of mobile dopants (306). The dopants (306) are considered mobile because they can be repositioned throughout the semiconducting region (304) as a result of an applied programming condition.

Throughout the specification and appended claims, the term "memcapacitor" or "memcapacitive" is used to describe a combination of an insulating/semiconductor matrix and a dopant which exhibits dopant motion in the presence of a programming electrical field and the desired long term dopant stability within the matrix when the programming field is removed. The memcapacitive effect is most strongly evident in nanometer scale devices and allows the device to "remember" past electrical conditions. Throughout the specification and appended claims, the term "memcapacitive matrix" describes a weakly ionic conductive material which is capable of transporting and hosting ions that act as dopants to control the flow of electrons through the memcapacitor. The definition of a weakly ionic conductive material is based on the application for which the memcapacitive device is designed. In general, it is desired for the memcapacitive device to stay in a particular state, either low or high capacitance, for an amount of time that may range from a fraction of a second to years, depending on the application. Thus, the diffusion constant for such a device is low enough to ensure the desired level of stability, but large enough to allow for a programming voltage to move the dopants through the memristive matrix.

In a memcapacitor, the two electrodes (314, 315) act as the capacitive plates and the mobile dopants (306) effectively alter the distance d between the plates by creating a highly conductive region which extends from one of the electrodes into the matrix (304). The farther the mobile dopants (306) extend from the electrode into the matrix, the smaller d becomes and the greater the capacitance of the memcapacitor.

In the low capacitive state illustrated in FIG. 3A, the mobile dopants (306) are concentrated in the right hand portion of the semi-conducting matrix (304). This dramatically increases the electrical conductivity of the matrix (304) where the mobile dopants (306) are concentrated. In this state, the effective distance d in Eq. 1 is fairly large, leading to a lower overall capacitance of the memcapacitor (304).

FIG. 3B is an illustrative diagram of a memcapacitor (300) in a high capacitance state. The mobile dopants (306) have been distributed through the matrix (304) by a programming voltage or condition such that the mobile dopants (306) are much closer to the left electrode (314). This brings the conducting surfaces of the capacitor (300) much closer together and d becomes small.

As discussed above, once the mobile dopants have been distributed by the application of a programming condition, they remain stable for a desired duration and through one or more read cycles. According to one illustrative example, the programming conditions may include a voltage which exceeds the breakdown voltage of a Schottky barrier between the memristive matrix and metal electrodes. The barrier then becomes conductive and allows current to flow through the matrix. This heats the matrix and increases the mobility of the dopants. This breakdown process is non-destructive and reversible, so long as the amount of current flowing does not reach levels that cause the semiconductor material to overheat and cause thermal damage.

The dopants then move under the influence of an applied electrical field to the desired location. The programming condition is removed and the matrix cools. The mobile dopants then remain in substantially the same position.

FIG. 3C is a graph which shows an illustrative nonlinear relationship between charge and applied voltage across a Schottky interface within a memcapacitor. The horizontal axis represents voltage applied to the interface. The vertical axis represents the resulting charge. Two curves are shown, a dash-dot curve (318) represents the charge as a function of voltage for the low capacitance state and a solid curve (320) represents the charge as a function of voltage for the high capacitance state. These two curves (318, 320) correspond to the states shown in FIGS. 3A and 3B, respectively. The arrows between the dash-dot line and the solid line illustrate the change in the charge/voltage relationship as the mobile dopants are reconfigured from the low capacitance state to the high capacitance state.

The low capacitance curve (318) shows little non-linearity and less sensitivity to changes in applied voltage. However, the high capacitance curve (320) shows significant nonlinearity in the number of charges present at a particular voltage applied voltage. To read a particular junction with the crossbar array, a voltage of $V_R/2$ is applied across a first intersecting line and a second voltage of $-V_R/2$ is applied over the second intersecting line. The memcapacitive junction which is interposed between the two intersecting lines then sees a voltage of $V_R$, while other elements are "half selected" and see only $V_R/2$ or $-V_R/2$. The behavior of the memcapacitor is nonlinear such that a relatively small charge is present when a voltage of $V_R/2$ is applied to the interface, but a much greater charge is present when a voltage of $V_R$ is applied.

The vertical dashed line labeled $V_{BI}$ represents the breakdown voltage (or built-in voltage) of the memcapacitive junction. According to one illustrative example, the breakdown voltage may be approximately three volts. When the applied voltage exceeds the breakdown voltage, the memcapacitive junction becomes conductive and electrical current passes through the junction. As discussed above, this can result in resistive heating of the matrix and a corresponding increase in the mobility of the mobile dopants. Consequently, the reading voltage across any given junction does not typically exceed the breakdown voltage. However, in some circumstances it can be desirable for the programming conditions to be such that the breakdown voltage is exceeded. This can significantly reduce the write time of the device because of the increase in dopant mobility.

Similar to the application of the reading voltage above, the programming voltage is applied by dividing the programming voltage into two portions, V/2 and −V/2. These voltages are applied to two intersecting lines so that only the selected device which is at the intersection is reprogrammed by the programming voltage V+.

Figure 4A:
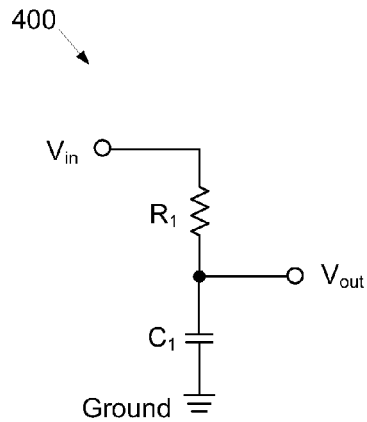
FIGS. 4A-4C are diagrams which describe an illustrative low pass filter and its implementation within a nanowire crossbar architecture, according to one example of principles described herein.
Figure 4B:
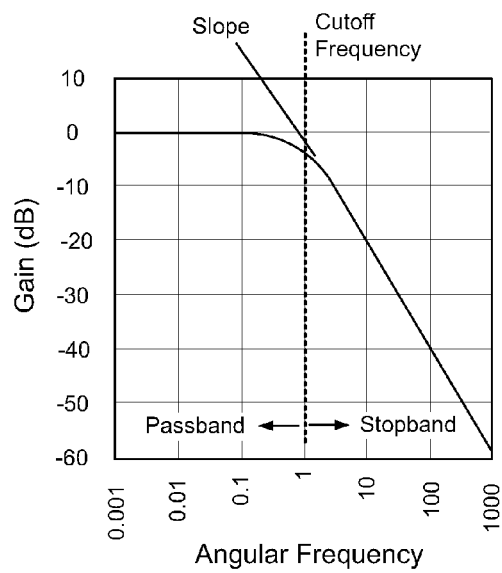
Figure 4C:
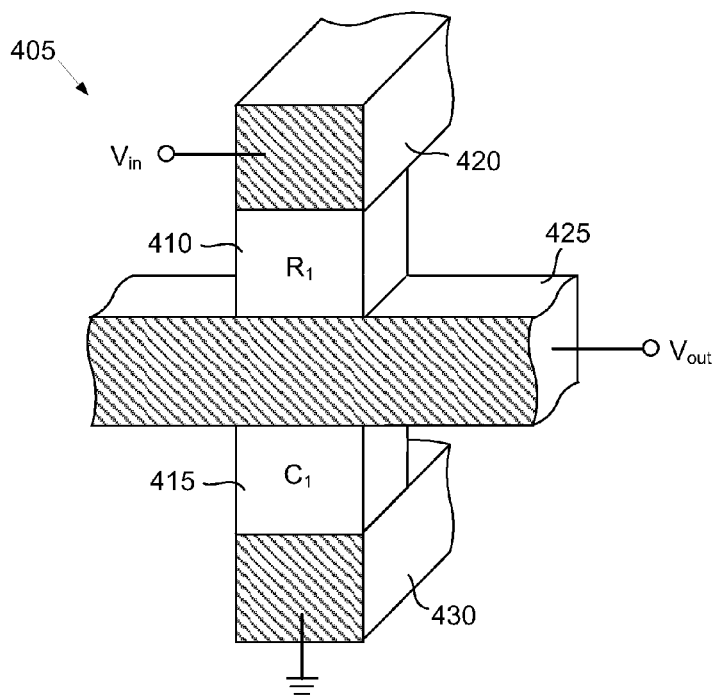

FIGS. 4A-4C are diagrams which describe an illustrative low pass filter (400) and its implementation within a nanowire crossbar architecture (405) which contains memcapacitive and memristive junction elements. A low pass filter is a circuit which passes low frequency signals but attenuates signals at frequencies which are higher than a cutoff frequency. The actual amount of attenuation, the cutoff frequency and other characteristics vary between circuits and can be adjusted by changing the components within a given circuit.

FIG. 4A shows a schematic of a low pass filter (400) which includes a capacitor $C_1$ and a resistor $R_1$. The input signal enters the circuit through $V_{in}$ and the filtered result is extracted through $V_{out}$. One way to understand the operation of this circuit is to focus on the time it takes for the capacitor to charge. At low frequencies, the capacitor has adequate time to charge up to levels which are substantially similar to the signal entering through $V_{in}$. Consequently, the capacitor blocks the passage of lower frequency from passing through to the ground. Instead, the lower frequencies pass to the $V_{out}$ node. At high frequencies, the capacitor only has time to charge up a small amount before the input switches direction. Consequently, the capacitor readily transfers high frequencies across its plate to the ground node and attenuates these high frequencies at the $V_{out}$ node.

FIG. 4B shows a Bode plot of the frequency response of the simple low pass filter described in FIG. 4A. The filter is characterized by a cutoff frequency and a slope which represents the rate of frequency roll off. The cutoff frequency is determined by the values of the resistors and capacitors in the circuit.

$$\omega_c = \frac{1}{R*C}$$

Where:
$\omega_c$=the cutoff frequency in radians per second
R=the resistance of $R_1$
C=the capacitance of $C_1$ FIG. 4C shows the low pass filter (400; FIG. 4A) implemented within a small portion of a crossbar architecture (405). In this example, the entire low pass filter (400, FIG. 4A) is implemented at a single intersection between three crossbars (420, 425, 430). Between the upper and center crossbar (420, 425), a memristive junction (410) with a resistance of $R_1$ is formed. Where the memristive junction (410) is formed on the nanoscale, it may exhibit resistances which range from tens of ohms to millions of ohms. Between the center crossbar and the lower crossbar (425, 430), a memcapacitor (415) with a capacitance of $C_1$ is formed. Where the memcapacitor (415) has nanoscale dimensions, it may exhibit capacitances which are on the order of picofarads. The input signal is input as $V_{in}$ on the upper crossbar (420). The output signal is extracted as $V_{out}$ from the center crossbar (425). The bottom crossbar (430) is grounded.

As discussed above, the values of $R_1$ and $C_1$ of the memristor (410) and memcapacitor (415) can be changed by applying a programming voltage across the appropriate junction. This can advantageously allow for on-the-fly reconfiguration of the low pass filter. Following reprogramming, the new values of $R_1$ and $C_1$ remain stable until another reprogramming voltage is applied. Consequently, as long as the signals input through $V_{in}$ do not approach the levels of the reprogramming voltage, the values of $R_1$ and $C_1$ will remain stable and act as a low pass filter.

FIGS. 4A through 4C are only one simple example of a first order low pass filter which could be implemented in a crossbar array. A variety of additional filter designs could also be implemented, including Butterworth filters with higher orders. Additionally, the implementation within the crossbar array could be significantly different than shown in FIG. 4C. For example, the filter could be implemented in a single layer of junction elements sandwiched between upper and lower crossbar layers.

FIGS. 5A-5C are diagrams which describe an illustrative high pass filter (500) and its implementation within a nanowire crossbar architecture (505). FIG. 5A is a schematic diagram which illustrates the components the high pass filter (500) and their arrangement. The components of the high pass filter are similar to those in the low pass filter, except the positions of the capacitor $C_1$ and resistor $R_1$ are reversed. The capacitor blocks or attenuates the passage of low frequency signals from the signal source $V_{in}$ and allows the higher frequency signals to pass through to the output $V_{out}$.

FIG. 5B shows the Bode plot of the frequency response of the high pass filter (500) described in FIG. 5A. The filter (500) attenuates frequencies below the cutoff frequency and passes frequencies which are greater than the frequency cutoff.

FIG. 5C shows an implementation of the high pass filter (500) described in FIG. 5A in a crossbar architecture. The components of the crossbar architecture are similar to those described above with respect to FIG. 4C, except the positions of the memcapacitor (515) and memristor (510) are reversed. In some examples, the memcapacitor (515) and memristor (510) may have the same physical structure, including the same matrix and dopant combination. By applying the appropriate programming voltages to the junction elements, the memcapacitor (515) may be converted into a memristor (510) and vice versa. For example, when at least portions of the mobile dopants in a matrix are spread from one electrode to another electrode, the junction element may exhibit memristive behavior. When mobile dopants are distributed throughout the matrix such that there are substantially no conductive paths through the matrix, the junction element may exhibit memcapacitive behavior.

To achieve the desired values within a circuit, two or more junction elements may be combined in series or parallel. For example, a desired value for $R_1$ may be 33 ohms, but the lowest resistance value of a junction element may be 100 ohms. Three junction elements with resistances of 100 ohms could be configured in parallel to produce a resistance of 33 ohms. Similarly, junction elements configured as memcapacitors could be used in parallel or in series to achieve the desired capacitance. In some examples, elements which are external to the crossbar array could also be used in the circuit. Additionally, the crossbars themselves exhibit resistance, capacitance, and inductance. By carefully selecting the crossbar configuration which supports the circuit, the electrical characteristics of the crossbars could be leveraged to provide the desired circuit performance.

Figure 6A:
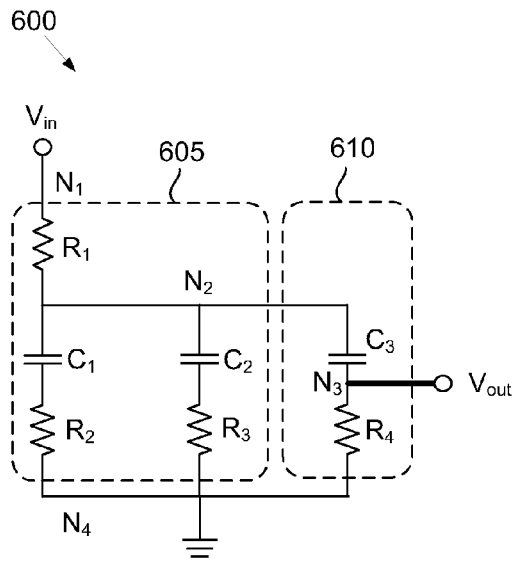
FIGS. 6A-6C are diagrams which describe an illustrative bandpass filter and its implementation within a multilayer nanowire crossbar architecture, according to one example of principles described herein.
Figure 6B:
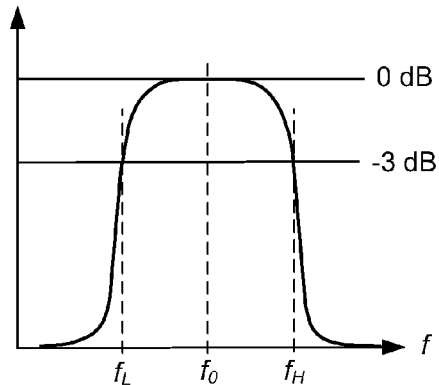
Figure 6C:
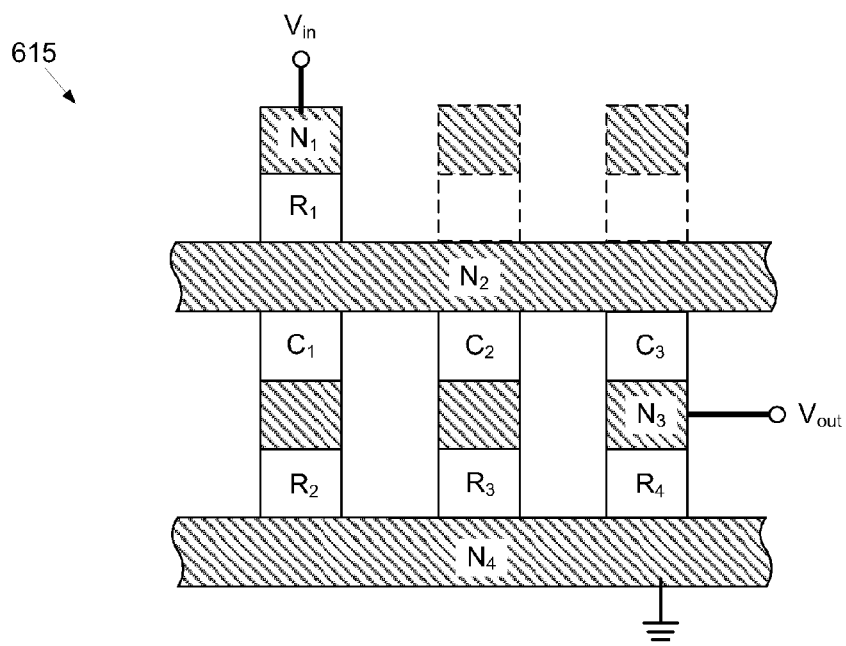

FIGS. 6A-6C are diagrams which describe an illustrative bandpass filter (600) and its implementation within a multi-layer nanowire crossbar architecture (615). FIG. 6A is a schematic which shows components of the analog bandpass filter (600) and their arrangement. In general, this illustrative bandpass filter (600) can be thought of as a low pass filter which has been combined with a high pass filter. The overlap of the pass band of the low pass filter and the pass band of the high pass filter produce a transmittance band.

The low pass portion (605) of the bandpass filter (600) is on the left side of the circuit and the high pass portion (610) is located on the right side of the circuit. The input signal $V_{in}$ is passed into the circuit at node $N_1$. The low pass portion (605) of the circuit (600) includes resistor capacitors $C_1$ and $C_2$, and resistors $R_2$ and $R_3$. In this example, resistors $R_2$ and $R_3$ are used as switches to selectively connect capacitors $C_1$ and $C_2$ to ground at node $N_4$. When resistors $R_2$ and $R_3$ have relatively low resistances, the capacitors $C_1$ and $C_2$ are in parallel and exhibit a combined capacitance which is greater than either $C_1$ or $C_2$.

The high pass portion (610) and low pass portion (605) are connected by node $N_2$. The high pass portion (610) includes capacitor $C_3$ and resistor $R_4$ which are joined by node $N_3$. The filtered signal $V_{out}$ is extracted at node $N_3$.

FIG. 6B is a Bode plot of the frequency response of an illustrative bandpass circuit. The high and low cutoff frequencies ($f_L$ and $f_H$) are defined as the points at which the signal is attenuated by −3 dB. The center frequency $f_0$ resides between the high cutoff frequency $f_H$ and the low cutoff frequency $f_L$. The characteristics of components in high bandpass portion (610) of the circuit can be adjusted to shift the low cutoff frequency $f_L$ and the characteristics of the low bandpass portion (605) can be adjusted to shift the high cutoff frequency $f_H$.

FIG. 6C shows the bandpass filter (600, FIG. 6A) implemented in a crossbar array (615). In this example, the input signal $V_{in}$ is input into an upper layer crossbar $N_1$. A second layer crossbar, $N_2$ is connected to the crossbar $N_1$ by resistor Attached to the underside of the second layer crossbar $N_2$ are memcapacitive junctions $C_1$, $C_2$, and $C_3$. Memcapacitors $C_1$ and $C_2$ are connected to the bottom crossbar $N_4$ through resistors $R_2$ and $R_3$. Bottom crossbar $N_4$ is connected to ground or another reference voltage. The output voltage $V_{out}$ is extracted from crossbar $N_3$ which is sandwiched between capacitor $C_3$ and resistor $R_5$. As discussed above, the output voltage $V_{out}$ contains the bandpass filtered signal. This example is only one of a number of ways in which a programmable analog filter could be implemented in a crossbar array.

A minimum size for the bandpass filter shown in FIG. 6C can be estimated from minimum feature sizes of the crossbar array. For example, if minimum feature size is 30 nanometers, the bandpass filter as shown in FIG. 6C would have a footprint of approximately 60×210×210 nanometers. This small size, the simplicity of the design, and the ability to stack multiple layers allows the large numbers of reprogrammable filters to be inexpensively implemented within a crossbar array architecture.

Figure 7:
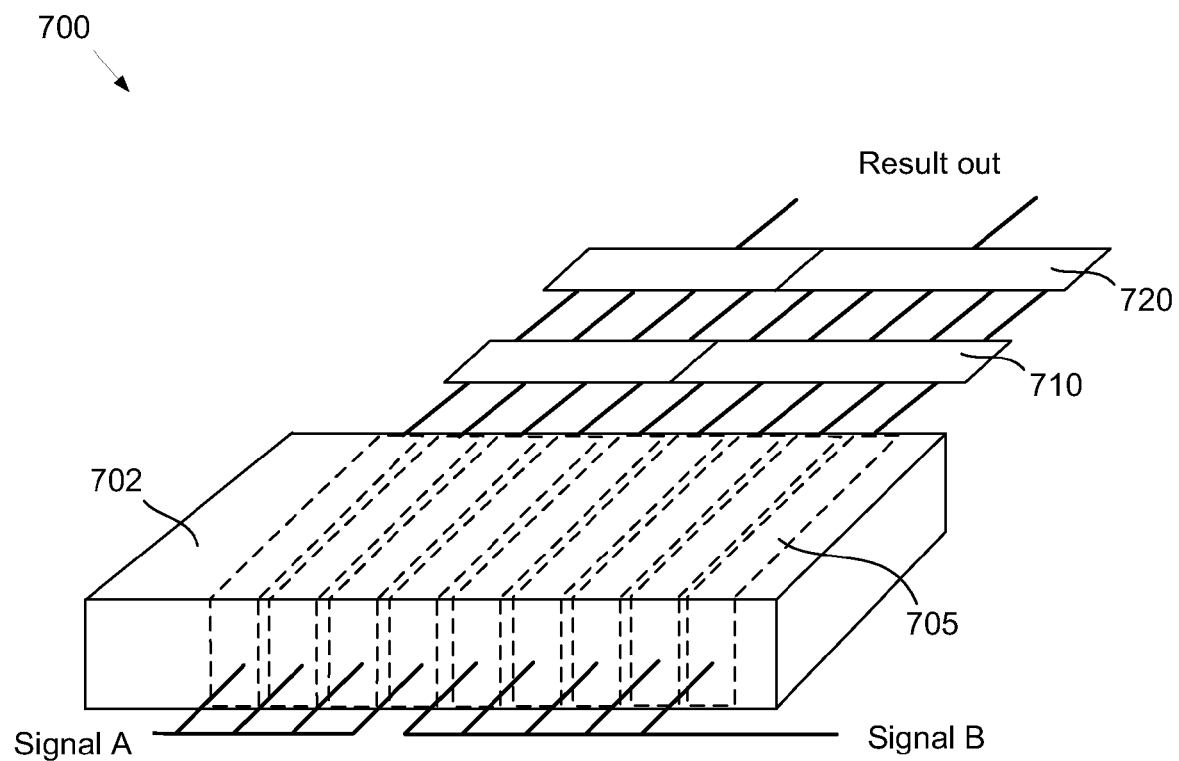
FIG. 7 is a diagram of an illustrative programmable analog filter, according to one example of principles described herein.

FIG. 7 is a diagram of an illustrative programmable analog filter (700) which includes multiple filter circuits (705) implemented in a crossbar array (702), an analysis module (710) and a comparison module (720). A portion of these bandpass filters (705) is allocated to Signal A and a second portion of the bandpass filters (705) is allocated to Signal B. In one example, the distribution of these signals could be accomplished within the crossbar array (705) by using memristors to selectively make connections between a first crossbar and intersecting crossbars.

The signals A and B are filtered into specified bands by the array of bandpass filters (705). These bands are passed to an analysis module (710). The analysis module (710) may perform a number of (?) operations, including peak detection. The output of the analysis module (710) is received by a logic module (720). The logic module (720) may also perform a number of functions, including storing a known profile or values and comparing the output of the analysis module with the known profile. The logic module (720) then outputs the result of the desired logic operation.

In some examples, the programmable analog filter (700) can be reconfigured. For example, the routing of the signals into the array of bandpass filters (702) could be handled by memristors within the crossbar array. To selectively connect or disconnect a given signal from a bandpass filter, the resistance of the memristor which is interposed between the signal line and the input line to the bandpass filter could be changed. As discussed above, the values of the memcapacitors and memristors within the bandpass filters could also be changed by applying a reprogramming voltage across the memcapacitor or memristor. In some examples, the value of the memcapacitors or memristors could also be read as described above. For example, after a programming voltage is applied, the capacitance and/or resistance values could be read. If the desired values were not attained, a second programming voltage could be applied to correct the values.

Figure 8A:
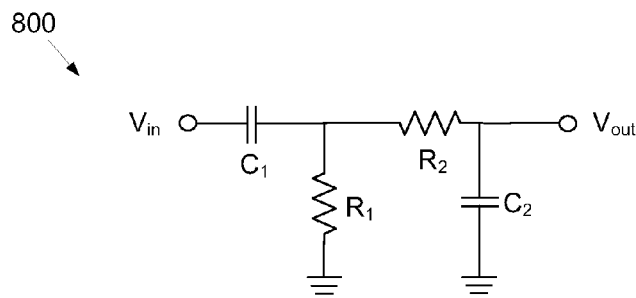
FIGS. 8A-8C are diagrams of illustrative bandpass filters implemented in a single layer nanowire crossbar architecture with external capacitors, according to one example of principles described herein.
Figure 8B:
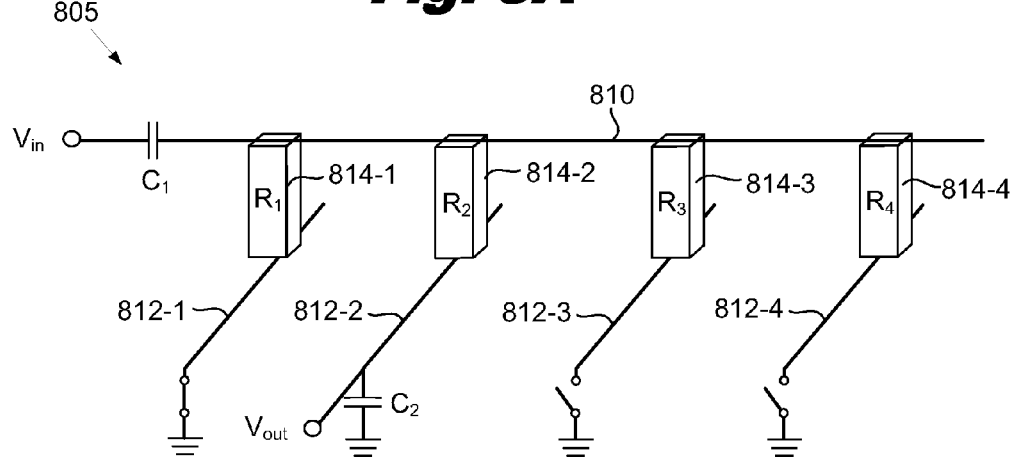
Figure 8C:
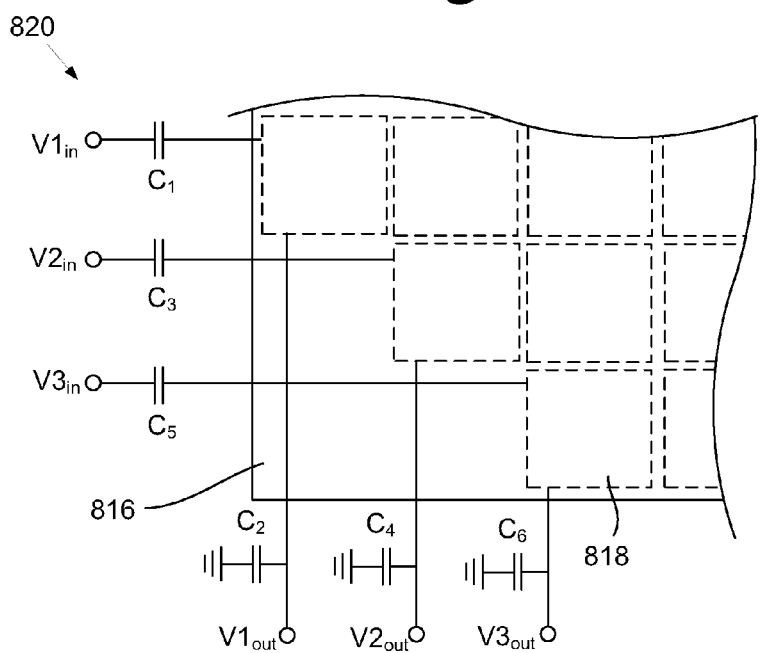

FIGS. 8A-8C are diagrams of illustrative bandpass filters (800) which are implemented in a single layer nanowire crossbar architecture (820) with external capacitors. FIG. 8A shows a schematic of the bandpass filter (800) and FIG. 8B shows the implementation (805) of the bandpass filter (800) in a single memristive crossbar layer. In this example, the capacitors $C_1$ and $C_2$ are external to the memristive crossbar layer. The input signal $V_{in}$ enters the circuit through at the left through an upper crossbar (810) and immediately encounters capacitor $C_1$. The capacitor $C_1$ blocks or attenuates lower frequency signals, but passes higher frequency signals. The greater the capacitance of the lower frequencies which are passed into the memristive crossbar layer along the upper crossbar (810). The upper crossbar (810) intersects a number of perpendicular lower crossbars (812). At the intersections, memristors (814) are interposed between the upper crossbar (810) and the lower crossbars (812). As discussed above, the memristors (814) exhibit a programmable resistance ($R_1$, $R_2$, $R_3$, $R_4$). A first memristor (814-1) exhibits a finite resistance $R_1$ and is part of the high pass portion of the bandpass filter (800). A second memristor (814-2) also exhibits a finite resistance $R_2$ as part of the low pass portion of the bandpass filter (800) and is connected to a lower crossbar (812-2) from which the filtered signal ($V_{out}$) is extracted. The lower crossbar (812-2) is connected to an external capacitor $C_2$ which allows high frequencies to pass through to ground but blocks lower frequencies to complete the bandpass filter (800). The values of the memristors (814) can be dynamically reprogrammed to change the operation of the bandpass filter (800). In some examples, the capacitance of the external capacitors ($C_1$, $C_2$) may also be altered.

Other memristors connected to the upper crossbar may be selectively connected or disconnected from the circuit for additional tuning. In this example, the memristors $R_3$ and $R_4$ have been disconnected from ground by a switch. In other examples, memristors $R_3$ and $R_4$ may simply be programmed to their highest resistive state, which may effectively disconnect the upper crossbar from the lower crossbars.

FIG. 8C shows a planar view of an array (820) of bandpass filters (800, FIG. 8A) which incorporate a memristive crossbar layer (816). The input lines ($V_{in}$, $V_{2in}$, $V_{3in}$) are located to the left and each input line has an in-line external capacitor ($C_1$, $C_2$, $C_3$). The input lines then pass into the memristive crossbar layer where the resistor network is used to connect and tune resistances between the upper crossbar and the lower crossbars. The output lines ($V_{1out}$, $V_{2out}$, $V_{3out}$) then exit from the bottom of the memristive crossbar layer (816). Each of the output lines is connected to an external capacitor. As can be seen in FIG. 8C, the memristive crossbar layer (816) can be segmented into a number of programmable resistor networks (818) which support the individual bandpass filters (800, FIG. 8A).

Figure 8D:
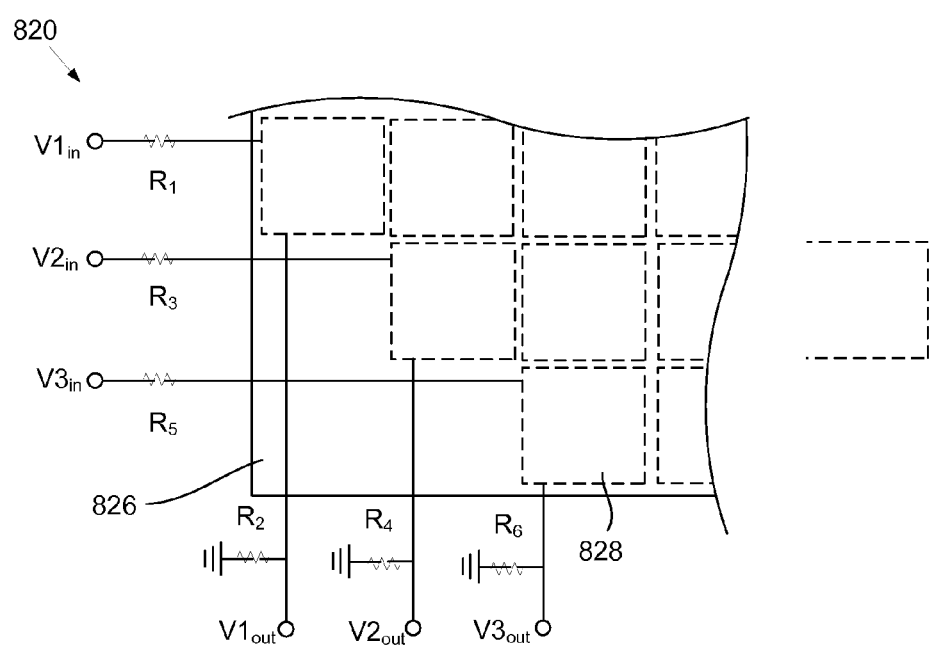
Fig. 8D is a diagram of illustrative bandpass filters implemented in a single layer nanowire crossbar architecture with external resistors, according to one example of principles described herein.

FIGS. 8A-8C illustrate bandpass filters which are implemented with external capacitors and internal memristive elements. A variety of other configurations could also be used. For example, as shown in Fig. 8D, external resistors ($R_1$-$R_6$) could be used in conjunction with memcapacitive elements (828) in a crossbar array (826). In other examples, a complete filter circuit is formed within the crossbar array and the external components are only auxiliary to the filter circuit.

Figure 9A:
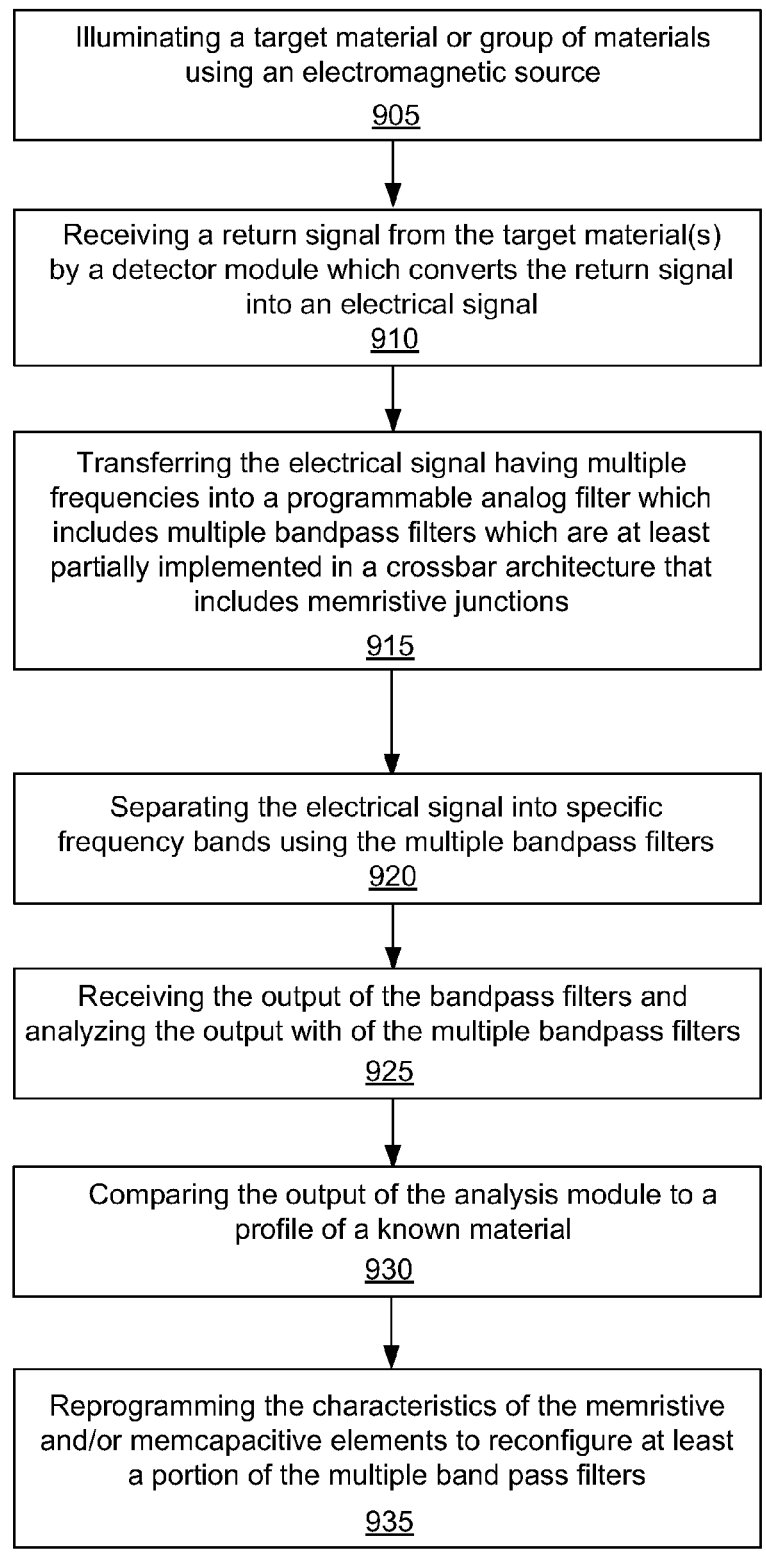
FIGS. 9A and 9B are flow charts of illustrative methods for using a programmable analog filter, according to one example of principles described herein.

FIG. 9A is a flow chart of an illustrative method for using a multichannel programmable analog filter. The multichannel programmable analog filter may be used in a variety of applications, including Radio Frequency IDentification (RFID) tagging and detection, radar signature analysis, or material identification. In one example, a programmable analog filter may be used to analyze return signals from a microwave illuminated material. Each material exhibits a characteristic return signal when illuminated with an appropriate microwave spectrum. For example, a material may have one or more frequencies in which the microwave spectrum is absorbed and one or more frequencies in which the microwave spectrum is reflected. Additionally, the strength of the absorption or reflection may allow for more specific identification of a material or class of materials.

In one example, a target material or RFID tag is illuminated using a electromagnetic source (block 905). Where identification of a specific material or group of materials is desired, the electromagnetic source could be a microwave source. Where identification of an RFID tag is desired, the electromagnetic source could be a radio frequency source. A return signal from the target material or object is received by a detector module and converted into an electrical signal (block 910). The electrical signal is passed into a programmable analog filter which includes multiple bandpass filters implemented in a crossbar architecture (block 915). The bandpass filters separate the electrical signal into specific frequency bands (block 920) which are characteristic of a specific material or class of materials. The output of the bandpass filters is received by an analysis module which can perform any of a number of functions, including but not limited to peak detection (block 925). The output of the analysis module is received by a logic module which can perform any of a number of functions, including but not limited to, comparing the output of the analysis module to a profile of a known material (block 930).

The characteristics of the memristive and/or memcapacitive elements are then reprogrammed to reconfigure the programmable analog filter (block 935). For example, the center frequencies, lower cutoff frequencies, and upper cutoff frequencies of the various bandpass filters may be reconfigured. Additionally, the signal routing may be changed to increase or decrease the number of bandpass filters which are allocated to a given input signal. In some examples, there may be multiple stages of bandpass filters, with wider bandpass filters being applied first to eliminate noise and divide the input signal into several broad frequency ranges. Higher order bandpass filters may next be applied to output of the first stage to more specifically identify and characterize the spectrum.

To identify a passive RFID tag using the method above, the RFID tag is illuminated with a wideband radio frequency source. The RFID tags have a characteristic signature which allows them to be uniquely identified. For example, the RFID tag may strongly absorb or reflect specific frequencies of the wideband radio waves. A detector or detectors sense the reflection from the RFID tag. The output of the detector or detectors is fed into the crossbar architecture which is configured with multiple bandpass filters. The bandpass filters divide the signal into specific frequency bands. The power in these bands can be analyzed to identify the unique signature of the RFID tag. In some situations, the power within the frequency bands can be converted into a number or alpha numeric sequence which uniquely identifies the RFID tag and/or the object to which the RFID tag is attached.

In other examples, the programmable analog filter may be in the RFID tag itself. The programmable analog filter may be connected to an antenna within the RFID tag. The "absorption" and "reflection" properties of the tag are changed by appropriately programming the response frequencies of the programmable analog filter in a non-volatile fashion. As an RFID reader progressively scans through a range of radio frequencies, the characteristics of components within the programmable analog filter dictate which radio frequencies the RFID tag absorbs or reflects. The pattern of absorption or reflection allows the RFID tag to be identified and may convey additional information about the object to which the RFID tag is affixed. The programmable analog filter can also be reprogrammed to update the information. Memristive and memcapacitive crossbar arrays may have particular advantages in creating the programmable analog filter within RFID tags because the crossbar arrays can be formed on a variety of substrates, including polymer and other flexible substrates.

Figure 9B:
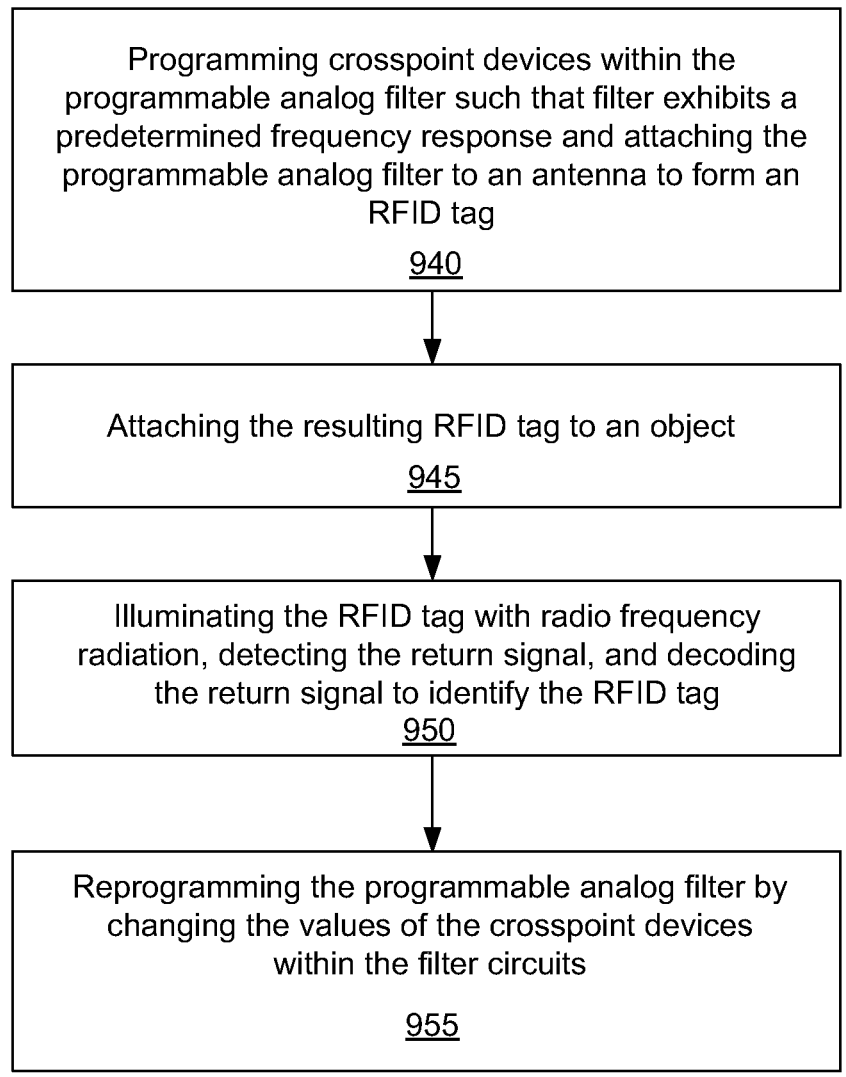

FIG. 9B is a flow chart of an illustrative method for using a multichannel programmable analog filter within a passive reprogrammable RFID tag. The crosspoint devices within the programmable analog filter are programmed so that the filter circuits exhibit a predetermined frequency response over multiple radio frequencies. The programmable analog filter is electrically connected to an antenna to form an RFID tag (block 940). The resulting RFID tag is attached to an object (block 945). The RFID tag is illuminated with radio frequency radiation and the return signal is detected (block 950). This allows for identification of the RFID tag and, by extension, object to which it is attached. The programmable analog filter can be reprogrammed to exhibit a different frequency response by changing the values of the crosspoint devices within the filter circuits (block 955). For example, the programmable analog filter may be reprogrammed to represent that the object has been transported, purchased, inventoried, or consumed.

In conclusion, the specification and figures describe a number of programmable analog filters which incorporate memristive and/or memcapacitive elements. The programmable analog filters may have a number of advantages, including a small footprint, straight forward implementation, low cost, low power dissipation, and ability to be dynamically reprogrammed.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A programmable analog filter comprises:
    a crossbar array comprising junction elements, the junction elements being programmable through movement of dopants within a matrix of the junction elements; and
    a filter circuit being implemented within the crossbar array; in which at least a portion of the junction elements form reprogrammable components of the filter circuit.

2. The filter of claim 1, in which the junction elements comprise memristive elements, a resistance of the memristive elements being reprogrammed by application of a programming voltage across the memristive elements.

3. The filter of claim 1, in which the junction elements comprise memcapacitive elements.

4. The filter of claim 1, in which an individual junction element is programmed as either a memristive or memcapacitive element.

5. The filter of claim 1, in which the programmable analog filter is connected to an antenna to form a passive reprogrammable RFID tag.

6. The filter of claim 1, in which the filter circuit comprises one of: a low pass filter, a high pass filter, and a bandpass filter.

7. The filter of claim 6, in which junction elements are dynamically reprogrammed through application of a programming voltage to reconfigure at least one of: the center frequency of the bandpass filter, the lower cutoff frequency of the bandpass filter, and the higher cutoff frequency of the bandpass filter.

8. The filter of claim 1, in which the junction elements are dynamically reprogrammed to selectively route an input signal to a different number of bandpass filters implemented in the crossbar array.

9. The filter of claim 1, in which the filter circuit is implemented in a single layer crossbar array, the single layer crossbar array comprising a first metallic layer, a junction layer and a second overlying metallic layer.

10. The filter of claim 1, further comprising external capacitors which are outside of the crossbar array, the external capacitors being used in conjunction with the filter circuit implemented within the crossbar array.

11. The filter of claim 1, further comprising external resistors which are outside of the crossbar array, the external resistors being used in conjunction with the filter circuit implemented within the crossbar array.

12. The filter of claim 1, in which the programmable analog filter is configured to receive a return signal from an RFID tag, the programmable analog filter dividing the return signal into a plurality of frequency bands, in which signal levels within the plurality of frequency bands provide information which allows the RFID tag to be identified.

13. A method for using the programmable analog filter of claim 1 within an RFID tag, the method comprising:
    programming crosspoint devices within the programmable analog filter such that the filter exhibits a predetermined frequency response and attaching the programmable analog filter to an antenna to form an RFID tag;
    illuminating the RFID tag with radio frequency radiation;
    detecting the return signal;
    decoding the return signal to identify the RFID tag; and
    reprogramming the programmable analog filter by changing the values of the crosspoint devices.

14. The filter of claim 1, wherein the filter circuit is implemented at a single intersection of first, second and third crossbars of the crossbar array,
    a first junction element between the first and second crossbars at the single intersection being programmed as a memristive element, and
    a second junction element between the second and third crossbars at the single intersection being programmed as a memcapacitive element.

15. A method for using a programmable analog filter that comprises: a crossbar array comprising junction elements; and a filter circuit being implemented within the crossbar array; in which at least a portion of the junction elements form reprogrammable components of the filter circuit, the method comprising:

transferring an electrical signal having multiple frequencies to the programmable analog filter, the filter comprising multiple bandpass filters, each bandpass filter being at least partially implemented within the crossbar array comprising memristive junctions;

separating the electrical signal into specific frequency bands using the multiple bandpass filters;

analyzing the output of the multiple bandpass filters; and reprogramming the characteristics of the memristive junctions to reconfigure at least a portion of the multiple bandpass filters.

16. The method of claim 15, further comprising:

illuminating an RFID tag using a broad band radio wave source;

receiving a return signal from the RFID tag and converting the return signal into said electrical signal input to the programmable analog filter comprising multiple bandpass filters; and comparing the output of the multiple bandpass filters to identify the RFID tag.

17. The method of claim 15, wherein reprogramming the characteristics of the memristive junctions to reconfigure at least a portion of the multiple bandpass filters comprises reconfiguring, through application of a programming voltage, a center frequency of at least one of the bandpass filters.

18. The method of claim 15, wherein reprogramming the characteristics of the memristive junctions to reconfigure at least a portion of the multiple bandpass filters comprises reconfiguring, through application of a programming voltage, a lower cutoff frequency of at least one of the bandpass filters.

19. The method of claim 15, wherein reprogramming the characteristics of the memristive junctions to reconfigure at least a portion of the multiple bandpass filters comprises reconfiguring, through application of a programming voltage, an upper cutoff frequency of at least one of the bandpass filters.

20. The method of claim 15, further comprising dynamically reprogramming junction elements to selectively route an input signal to a different number of the multiple bandpass filters implemented in the crossbar array.

* * * * *